(12) United States Patent
Klimek

(10) Patent No.: US 9,620,097 B2
(45) Date of Patent: Apr. 11, 2017

(54) GUITAR AMPLIFIER CIRCUITRY

(71) Applicant: BAD CAT HOLDINGS, LLC, Irvine, CA (US)

(72) Inventor: George Klimek, Irvine, CA (US)

(73) Assignee: BAD CAT HOLDINGS, LLC, Santa Ana, CA (US)

( * ) Notice: Subject to any disclaimer, the term of this patent is extended or adjusted under 35 U.S.C. 154(b) by 93 days.

(21) Appl. No.: 14/595,625

(22) Filed: Jan. 13, 2015

(65) Prior Publication Data

US 2015/0200629 A1 Jul. 16, 2015

Related U.S. Application Data

(60) Provisional application No. 61/927,407, filed on Jan. 14, 2014.

(51) Int. Cl.
| | | |
|---|---|---|
| *G10H 3/18* | (2006.01) | |
| *H03F 3/181* | (2006.01) | |
| *H03F 5/00* | (2006.01) | |
| *H03G 3/08* | (2006.01) | |
| *H03G 3/12* | (2006.01) | |
| *H03G 3/30* | (2006.01) | |

(52) U.S. Cl.
CPC .............. *G10H 3/18* (2013.01); *G10H 3/186* (2013.01); *H03F 3/181* (2013.01); *H03F 5/00* (2013.01); *H03G 3/08* (2013.01); *H03G 3/12* (2013.01); *H03G 3/301* (2013.01); *H03F 2200/405* (2013.01)

(58) Field of Classification Search
CPC ...... H03F 2200/405; H03F 3/181; H03F 5/00; H03G 3/12; H03G 3/301; H03G 3/08; G10H 3/18; G10H 3/186
USPC ....... 381/120, 319; 330/310, 311, 81, 55, 86
See application file for complete search history.

(56) References Cited

U.S. PATENT DOCUMENTS 9,184,714 B2 * 11/2015 Scott ..................... H03G 3/06

* cited by examiner

*Primary Examiner* — David Ton
(74) *Attorney, Agent, or Firm* — Stetina Brunda Garred & Brucker

(57) ABSTRACT

Amplifier circuitry that is operative to provide selective control of the amplitude of a musical signal as the signal transitions from the pre-amplifier to power amplifier components of an electric guitar amplifier. According to a preferred embodiment, at least one low variable power amplifier is integrated into the signal path from the pre-amplifier to the power amplifier components of the guitar amplifier. The low power amplifier allows for selective control of the amplitude of the musical signal such that the signal ranges from 'zero volts' to more than 100 DB. Such low power amplifiers may be selectively deployed in guitar amplifiers utilizing either Class A or Class A/B circuitry and enables a musician to have full control of the power amplifier from 0% gain to 100% gain at any tone selection and any power amp wattage, as may be desired.

6 Claims, 2 Drawing Sheets

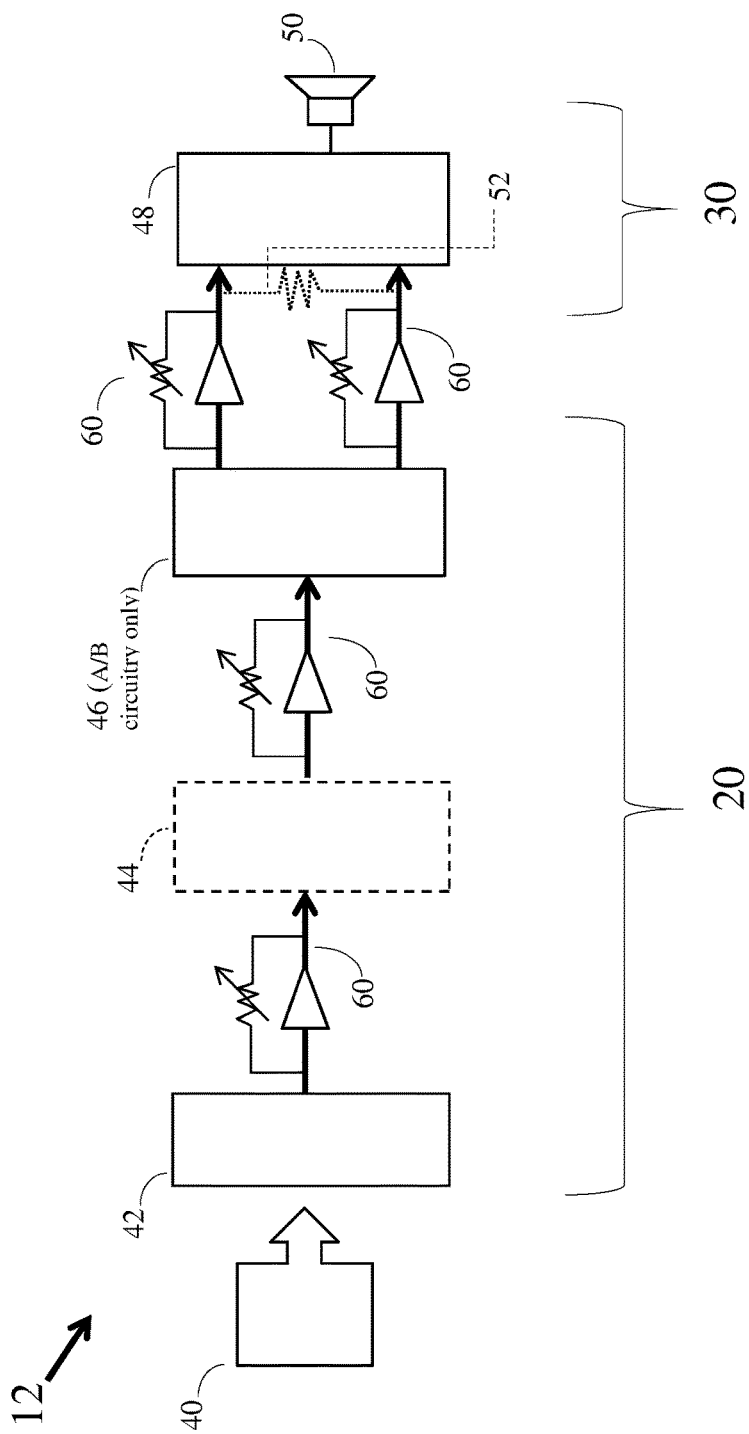
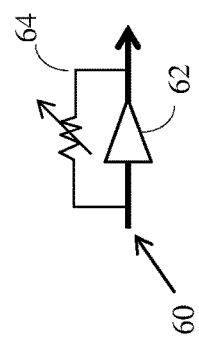

GUITAR AMPLIFIER CIRCUITRY

CROSS-REFERENCE TO RELATED APPLICATIONS

The present patent application claims priority to U.S. Provisional Patent Application Ser. No. 61/927,407, entitled GUITAR AMPLIFIER CIRCUITRY, filed on Jan. 14, 2014, all of the teachings of which are incorporated herein by reference.

STATEMENT RE: FEDERALLY SPONSORED RESEARCH/DEVELOPMENT

Not Applicable

BACKGROUND

Electric guitar amplifiers, their components and modes of operation are well-known in the art. Although the circuitry associated with electric guitar amplifiers have taken literally thousands of variations and have been incorporated into numerous commercial embodiments made by such famous manufactures as Marshall and Fender, the basic design and layout of a standard electric guitar amplifier is well-known and readily-understood by those skilled in the art.

Essentially, and referring to FIG. 1, the standard electric guitar amplifier 10 includes a pre-amplifier or pre-amp 20 and a power amplifier 30. The pre-amp portion 20 is operative to pre-amplify a signal 40 received from the guitar to a level high enough to be consumed by the power amplifier 30. As is well-known to those skilled in the art, one or more successive modifications to the guitar input signal 40', 40", 40''', such as by EQ, pre-amp gain and presence, that sequentially affect the amplified signal that is ultimately fed to the power amplifier are all part of the pre-amp section 20.

The signal 40''' ultimately received by the power amplifier 30 is that substantially "amplified" with the subsequent output signal being transmitted to the speaker 50. As is well-known, the more driven the power amplifier 30, which occurs as the volume is increased, the more the power amplifier will affect the tone. As a general rule, the louder the volume the more break-up/distortion/wideness of sound will be generated from the electric guitar amplifier. Numerous other factors also affect the tone and sound of the amplifier, too, which are the topics of countless articles and guitar player websites. Most notable is the choice of amplifier components, and in particular the vacuum tubes incorporated in the pre-amp and power amplifier that can dramatically affect the sounds and tones ultimately produced, which are all ultimately a matter of musician preference.

Electric guitar amplifiers are further typically characterized by the circuit configuration utilized at the power amplifier stage, namely, either Class A or Class A/B. Class A, incorporated into certain well-known vintage amplifiers produced by VOX, are characterized by the fact that the circuit design provides for a current that is flowing at all times through the power tubes. As for Class A/B, a negative "bias" of voltage is applied with at least two tubes conducting approximately 180 degrees out of phase relative one another, as provided by splitter 46 as shown in FIG. 1. As a consequence, one vacuum tube will be caused to "shut off" when an audio wave form is below a certain point while the other tube and associated circuit turns on (i.e., before the first one turns off), and thus reproduces the rest of the wave form. As a consequence, the combination of the two vacuum tubes cooperates to produce the full audio wave form. Such Class A/B circuitry is typically associated with amplifiers produced by Marshall and Fender.

A further feature typically employed with electric guitar amplifiers is the integration of a master volume control, shown as 52 in FIG. 1. Such feature, which was first produced by Marshall in 1975, is integrated between the pre-amp output and the power amplifier to thus overdrive the pre-amp signal. In this regard, the master-volume feature can thus impart a controlled amount of the overdriven signal that is fed to the power amplifier, and consequently causes the amplifier to produce overdriven, distorted signals at reasonable volume levels. In this regard, the master volume essentially allows guitar player to explore levels of overdrive using small signals capable of being contrived to overload to a virtually unlimited degree which would otherwise be impossible to do in the power stage where similar levels of overdrive would unquestionably damage the amplified componentry.

Problematic with master volume controls, however, is that such control is designed to only attenuate the signal fed to the power amplifier, and not amplify it. Indeed, the term "master volume" is actually a misnomer insofar as such control feature performs exactly opposite of what it does. As such, by application of the master volume control feature, the attenuation of the musical signal as it is transmitted from the pre-amplifier to the power amplifier can degrade greatly as the master volume control is turned down. Thus, the guitarist can only "take away" from the signal and not otherwise add to the signal, and deprives the player of a tremendous opportunity to modify the gain at a specific tone selection, and much less ultimately amplify such signal at a specific power amp wattage the guitarist may need or want.

As a consequence, conventional master volume controls are thus very limiting in nature, and do not afford any opportunity to yet selectively amplify a signal fed from a pre-amplifier to a power amplifier that has qualities that many a guitarist would desire but for the limitations of the prior art. Unfortunately, the means for providing such functionality has not been available in the art.

BRIEF SUMMARY

The present invention specifically addresses and alleviates the above-identified deficiencies in the art. In this regard, the present invention is directed a novel electric guitar amplifier circuitry whereby one or more low power amplifiers with variable resistance are placed in the signal path between the pre-amplifier and power amplifier components of an electric guitar amplifier. The low power amplifier is operative to selectively control the amplitude of the musical signal from essentially 'zero volts' or no signal to more than 100 DB. To that end, the present invention incorporates a potentiometer in combination with such low power amplifiers to thus enable the player to possess full control of the power amplifier from a 0% gain to 100% gain at any tone selection and at any power amp wattage the artist needs. The need for any type of master volume control is eliminated.

According to such arrangement, such signal is deemed pure and clean and has not been attainable through prior art circuitry design. The incorporation of such variable low power amplifiers can also be used in either Class A or Class A/B circuit configurations, and can be deployed in one or in multiple locations along the signal path.

BRIEF DESCRIPTION OF THE DRAWINGS

These as well as other features of the present invention will become more apparent upon reference to the drawings.

FIG. 2 is a schematic layout of the amplifier of FIG. 1 as modified by variable low amplifier circuitry components integrated at select locations in the signal path between the pre-amplifier and power amplifier components of the electric guitar amplifier, depending on whether the pre-amplifier is either Class A or Class A/B, and eliminating the master volume control.

FIG. 2a illustrates an exemplary variable low power amplifier as integrated within the guitar amplifier circuitry of the present invention.

DETAILED DESCRIPTION

Figure 1:
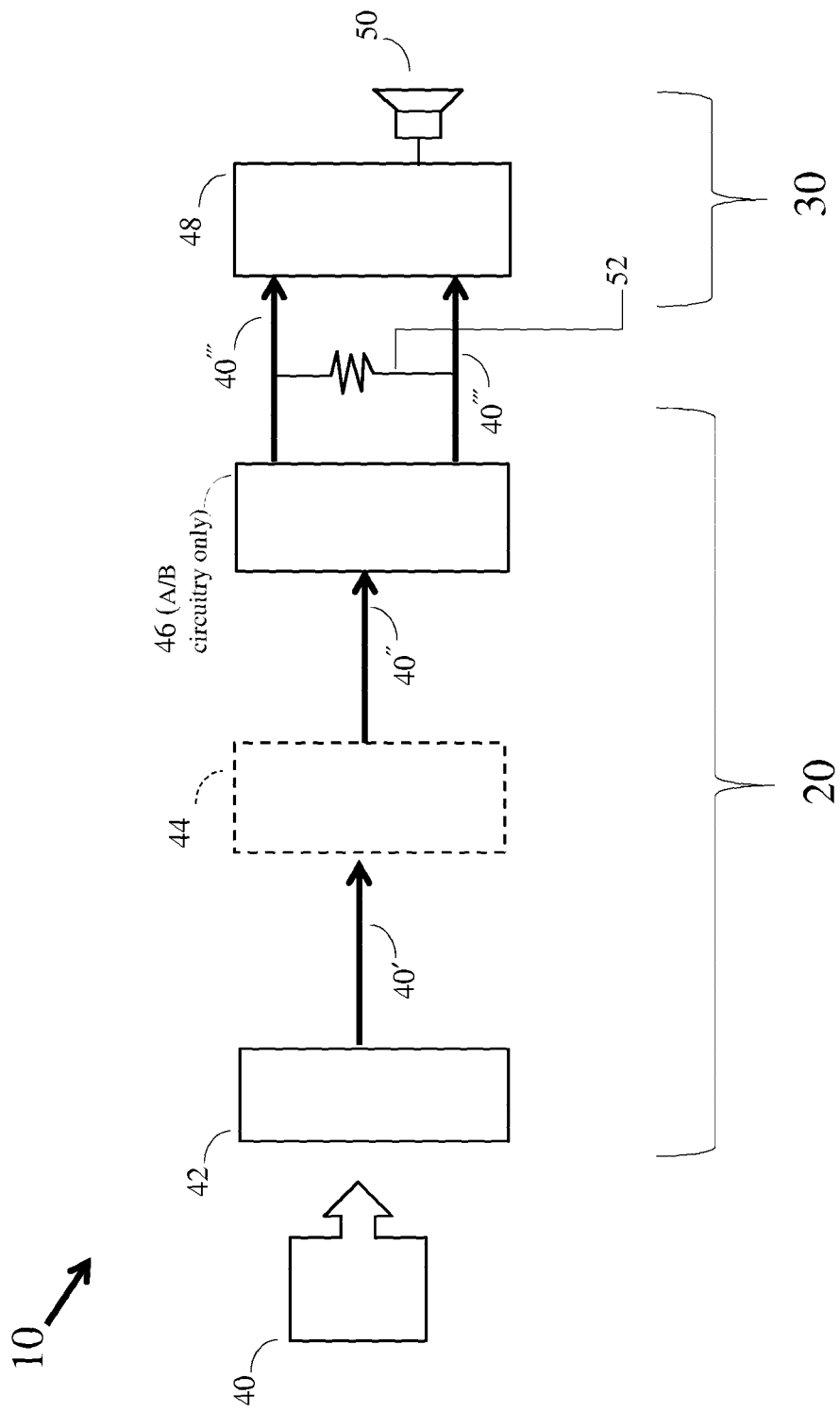
FIG. 1 is a schematic layout for a standard electric guitar amplifier having a pre-amplifier and power amplifier with a master volume control, with optional splitter for Class A/B circuitry.

The detailed description set forth below is intended as a description of the presently preferred embodiment of the invention, and is not intended to represent the only form in which the present invention may be implemented or performed. The description sets forth the functions and sequences of steps for practicing the invention. It is to be understood, however, that the same or equivalent functions and sequences may be accomplished by different embodiments and that they are also intended to be encompassed within the scope of the invention.

Referring now to FIG. 2, there is shown a schematic diagram showing a modified guitar amplifier circuitry 12 constructed in accordance with a preferred embodiment of the present invention. As per the standard amplifier layout of FIG. 1, the amplifier circuitry 12 of the present invention include a pre-amplification section 20, including a first valve, transistor or other like device 42, as well as optional additional pre-amplifier valves, (tubes), transistors and the like, an example of which is shown in phantom at 44, which is symbolic of a multiplicity of pre-amplifier components that may be integrated as part of the pre-amplifier circuitry of the amplifier, as is well-known to those skilled in the art.

Likewise, the guitar amplifier circuitry of the present invention 12 includes a power amplifier 30 coupled to a speaker 50 producing the audible signal. Per conventional circuitry, a signal 40 which emanates from the electric guitar will be transmitted through the pre-amplifier componentry 20, to produce a first amplified signal, that passes to power amplifier 30 and ultimately to the speaker 50.

The present invention integrates a variable low power amplifier 60, as illustrated in FIG. 2a, that is operative to control the amplitude of the amplified signal. As illustrated, the low power amplifier 60 comprises the combination of an amplifier component 62 with a variable resistor 64 coupled therewith. As will be understood by those skilled in the art, the low power amplifier 60 may take any of a variety of forms well-known to those skilled in the art, including an amplifier component 62 that comprise valve or tube amplifiers, transistors, field-effect transistors (FETs), or the like and a variable resistor 64 coupled therewith that is operative to vary the interstage music signal prior to being amplified by the power amplifier 60. According to a preferred embodiment, the variable resistance will be provided by a conventional potentiometer operative to vary the interstage music signal by +/−50 DB. In this regard, such potentiometers are well-known to those skilled in the art and typically comprise a simple knob that provides a variable resistance that in turn determines the output of current applied to the circuit.

Such low power amplifiers 60 are shown in FIG. 2 and may be incorporated at numerous positions in the signal path from the pre-amplifier 20 to the power amplifier 30. In this regard, the present invention contemplates that at least one such low-power amplifier with variable resistance 60 may be deployed, but that two or more may be deployed at any interval in the signal path as may be desired. Moreover, the improved guitar amplifier circuitry of the present invention may be incorporated in amplifiers using either Class A or Class A/B circuitry. With respect to the latter, and as illustrated in FIG. 2, it is contemplated that the variable low power amplifiers 60 may be incorporated at the output of phase splitter 46 as utilized in connection with Class A/B circuitry. As will be readily understood by those skilled in the art, such phase splitter would be inapplicable for Class A.

As a consequence of the integration of one or more variable low power amplifiers 60 in the signal path interposed between the componentry of the pre-amplifier 20 and power amplifier 30, the use of master volume control, shown in phantom as 52, is thus eliminated. The effect of the low power amplifier 60 thus produces a second modified signal having a selectively controllable amplitude. Such second modified signal is then fed to the power amplifier to ultimately produce a third or final signal that is transmitted to a speaker.

As a consequence, the guitarist has a multiplicity of options to control the amplitude of the musical signal from no signal or 'zero volt' to more than 100 DB. The guitarist thus has full control of the power amplifier from 0% gain to 100% gain at any tone selection and any power amp wattage the guitarist desires. Moreover, the signal being fed from the pre-amp 20 to the power amplifier 30 is essentially pure and clean, and not otherwise solely attenuated as occurs per convention "master volume" controls that exclusively attenuate and not amplify. As such, the musical signal is never degraded by virtue of the guitar amplifier circuitry of the present invention, which would occur otherwise via the use of prior art standard master volume controls as that control is turned down.

The guitarist is thus presented with a myriad of options in terms of control of sound and selective control of the musical signal that has not heretofore been attainable, and results in a substantially greater variety of tones that are amplified as intended by the guitarist, and not otherwise degraded, modified or otherwise compromised as occurs per conventional master volume control.

Additional modifications and improvements of the present invention may also be apparent to those of ordinary skill in the art. Thus, the particular combination of parts and steps described and illustrated herein is intended to represent only certain embodiments of the present invention, and is not intended to serve as limitations of alternative devices and methods within the spirit and scope of the invention.

What is claimed is:

1. A circuit for an electric guitar amplifier comprising:
   a pre-amplifier operative to receive a signal from an electric guitar and producing a first amplified signal;
   a phase splitter for a Class A/B power amplifier operative to split said first amplified signal into first and second signal paths;
   at least one variable low power amplifier integrated within the signal path of each respective signal transmitted from said phase splitter, said at least one variable low power amplifier being operative to receive said first amplified signal from a respective signal path and control the amplitude of said first amplified signal to produce a second modified signal; and a power amplifier for receiving said second modified signal from said at least one variable low power amplifier and amplifying said second modified signal to produce a third signal that is transmitted to a speaker.

2. The circuit of claim 1 wherein said circuit includes at least two variable low power amplifiers wherein both respective ones of said low power amplifiers are operative to control the amplitude of said signal received from said pre-amplifier.

3. The circuit of claim 1 wherein said at least one variable low power amplifier is integrated within the pre-amplifier of said circuit.

4. The circuit of claim 1 wherein each respective one of said variable low power amplifiers is operative to control the amplitude of the first amplified signal from zero volts to at least 100 DB.

5. The circuit of claim 1 wherein said variable low power amplifier comprises the combination of an amplifying device and a variable resistor.

6. The circuit of claim 5 wherein said amplifying device is selected from the group consisting of transistors, FETs and vacuum tubes and said variable resistor device comprises a potentiometer.

* * * * *